United States Patent
Wu (10) Patent No.: US 7,738,250 B2
(45) Date of Patent: Jun. 15, 2010

(54) WATER-COOLING RADIATOR FOR A COMPUTER CHIP

(75) Inventor: Chun-Kai Wu, Tainan (TW)

(73) Assignee: Chang Jung Christian University, Tainan (TW)

(*) Notice: Subject to any disclaimer, the term of this patent is extended or adjusted under 35 U.S.C. 154(b) by 0 days.

(21) Appl. No.: 12/198,660

(22) Filed: Aug. 26, 2008

(65) Prior Publication Data

US 2009/0185343 A1 Jul. 23, 2009

(30) Foreign Application Priority Data

Jan. 17, 2008 (TW) ............... 97101819 A (51) Int. Cl.
H05K 7/20 (2006.01)
H01L 23/36 (2006.01)

(52) U.S. Cl. ............ 361/699; 361/679.47; 361/679.53; 361/702; 361/709; 361/710; 165/80.2; 165/80.4; 165/80.5; 165/104.27; 165/104.33; 62/259.2

(58) Field of Classification Search ............ 361/679.46, 361/679.47, 679.53, 688, 699–703, 709–710, 361/718–719; 165/80.2, 80.3, 80.4, 80.5, 165/104.33, 104.22, 120, 104.25, 104.28, 165/185; 62/259.2; 257/714
See application file for complete search history.

(56) References Cited

U.S. PATENT DOCUMENTS

| | | | |
|---|---|---|---|
| 6,600,649 B1 * | 7/2003 | Tsai et al. .................. 361/697 |
| 6,648,064 B1 * | 11/2003 | Hanson ...................... 165/120 |
| 6,702,002 B2 * | 3/2004 | Wang ........................ 165/80.3 |
| 6,906,919 B2 * | 6/2005 | Pokharna et al. ....... 361/679.21 |
| 7,054,548 B2 * | 5/2006 | Inoue et al. ................. 392/496 |
| 7,100,677 B2 * | 9/2006 | Lee et al. ................... 165/80.4 |
| 7,219,714 B1 * | 5/2007 | Heydari ..................... 165/80.4 |
| 7,245,495 B2 * | 7/2007 | Ouyang ..................... 361/701 |
| 7,327,570 B2 * | 2/2008 | Belady ................... 361/679.48 |
| 7,343,963 B2 * | 3/2008 | Zoodsma ............... 165/104.33 |
| 7,418,996 B2 * | 9/2008 | Liu et al. ................... 165/80.4 |
| 7,423,874 B2 * | 9/2008 | Ouyang ..................... 361/699 |
| 7,466,550 B2 * | 12/2008 | Yeh et al. ................... 361/700 |
| 7,472,743 B2 * | 1/2009 | Liu et al. ................... 165/80.4 |
| 7,537,048 B2 * | 5/2009 | Liu et al. ............... 165/104.33 |
| 7,604,040 B2 * | 10/2009 | Ghosh et al. ............... 165/80.3 |
| 2006/0185378 A1 * | 8/2006 | Duan et al. ................ 62/259.2 |
| 2007/0184320 A1 * | 8/2007 | Domen ........................ 429/26 |
| 2008/0179044 A1 * | 7/2008 | Hu et al. .................... 165/80.4 |

* cited by examiner

Primary Examiner—Michael V Datskovskiy
(74) Attorney, Agent, or Firm—Birch, Stewart, Kolasch & Birch, LLP (57) ABSTRACT

A water-cooling radiator for a computer chip is provided to lower the temperature of the computer chip. The radiator includes a body on which other elements can be fixed and providing an interface for heat exchange, an internal circulation flow path built inside the body to provide a passage required for the coolant to flow through, and a pump fixed to the side of the body near the computer chip to provide power required for the coolant circulation.

10 Claims, 6 Drawing Sheets

WATER-COOLING RADIATOR FOR A COMPUTER CHIP

BACKGROUND OF THE INVENTION

1. Field of the Invention

The invention relates to a water-cooling radiator for a computer chip. In particular, the invention relates to a radiator having a built-in and branched coolant circulation flow path with air-cooling and water-cooling mechanisms.

2. Description of Related Art

Over the years, both the device density and the processing speed of a computer chip (integrated circuit) have increased significantly in keeping up pace with functional enhancement of electronics appliances. Besides that the processing speed has multiplied, the amount of heat generated by the computer chip has also increased. It is an important issue to dissipate heat for a chip application.

Demanded by an urging need to boost performance, computer chips like the CPU (central processing unit), the GPU (graphics processing unit), the northbridge chip, and the RAM (random access memory) have to increase their operating frequencies, resulting in increases in power consumption and heat generation. If the heat generated by the chip cannot be effectively removed thus resulting in a significant increase of temperature, problems such as semiconductor characteristics offset, transistor functional failure, or a computer crash might occur, or even more drastically, a chip burnout.

Generally, dissipation of the heat generated by a computer chip includes the following two steps of: (1) first conducting the heat generated by a computer chip to dissipating fins of a radiator; and (2) then conducting the heat from the dissipating fins to surrounding air. The two steps are both indispensable; if either step encounters a problem, the heat conduction would be affected, which hinders a radiator to dissipate heat effectively. Therefore, a basic design principle for a radiator is maximizing the heat transfer in step (1) and step (2) as a key purpose.

As disclosed in Taiwanese Patent Issue No. 00460773, a conventional air-cooling radiator uses high thermal conductivity of metals to conduct the heat generated by a computer chip to dissipating fins and dissipates the heat into ambient air by natural convection or forced convection with a fan. To increase the amount of heat transfer from the dissipating fins to the surrounding air in step (2), a common improvement is to increase the surface area of the dissipating fins contacting the surrounding air. However, for a heat dissipating body used in the steps, an increase in surface area indicates a decrease in solidity (a measure of the percentage of space taken up per unit volume) and a decrease in the cross area of heat conduction paths, thus relatively affecting the heat transfer from the chip to the dissipating fins in step (1). Conversely, if the solidity of the body is increased to increase the heat transfer in step (1), the surface area is then reduced, hence affecting the heat transfer in step (2). The solution to this dilemma is aimed to accelerate the heat dissipation in step (1) meanwhile increasing the heat dissipating surface and decreasing the solidity. In this regard, a water-cooling radiator has been designed.

The thermal conductivity of water is about twenty-three times that of air; the specific heat per unit mass of water is about seventeen times that of air; and the specific heat per unit volume of water is at least fourteen-thousand times that of air. Therefore, in the case of same contacting area or surface area, a water-cooling radiator has a cooling performance much better than that of an air-cooling radiator, despite having problems in covering the coolant, driving the coolant and preventing leakage of the coolant. Generally, a water-cooling radiator has a more complex structure and has a higher price, so it is less commonly used.

As disclosed in Taiwanese Patent Issue No. M257612, a conventional water-cooling radiator has coolant circulation pipelines on the exterior of a radiator. The coolant is injected into the vicinity of a computer chip to absorb heat, and the heat is brought out by heat convection to expedite the heat transfer in step (1) above and hence improve heat dissipation. Nevertheless, this type of water-cooling radiator has a more complex structure, and the coolant circulation pipelines and the dissipating fins may make an improper contact or have some gaps therebetween, resulting in a lower heat dissipation efficiency.

It is common currently to have to face and resolve the challenge of heat dissipation for a high performance computer chip. Limited by performance, a conventional air-cooling radiator no longer satisfies the heat dissipation requirement for a computer chip of higher processing speed. It is therefore in the respect of processing speed of the computer chip, an unsolved heat dissipation problem would seriously hinder the further development of the computer chip.

Coping to improve the performance of heat dissipation for a computer chip, the invention provides both advantages of an air-cooling radiator and a water-cooling radiator. In other words, the invention provides a simple structure of an air-cooling radiator and a high heat dissipation performance of a water-cooling radiator.

SUMMARY

The invention relates to a water-cooling radiator for a computer chip. The radiator includes a body having a chip mounting surface and a plurality of parallelly arranged dissipating fins, an internal circulation flow path built inside the body to provide a passage required for the coolant to flow through, and a pump fixed to the side of the body near the computer chip to provide power to drive the coolant to flow. The internal circulation flow path includes a first communication region, a second communication region, a third communication region, one or more parallelly arranged dissipating flow paths for the coolant to flow through underneath the chip mounting surface, the one or more dissipating flow paths having two ends respectively connected the second communication region and the third communication region, and a plurality of parallelly arranged circulation branches connecting the first communication region and the third communication region, and the pump enables the first communication region to connect to the second communication region. Moreover, the chip mounting surface provides a heat conduction interface between the computer chip and the body. The one or more dissipating flow paths transmit the heat generated by the chip and conducted to the chip mounting surface, to the coolant, and the pump drives the coolant such that the coolant flows through the plurality of parallelly arranged circulation branches, thereby the heat generated by the chip is transmitted to the plurality of dissipating fins and then to external environment. Alternatively, the chip mounting surface directly conducts heat generated by the computer chip to the plurality of dissipating fins to transmit the heat to external environment. The invention has the advantages of a built-in circulation flow path improving the heat conduction efficiency and contributing to a simpler structure than that of the prior art, a branched circulation flow path covering a larger extent of the body surface with the coolant and having a better heat dissipation efficiency, both air-cooling and water-cooling mechanisms performed on a single piece allowing flexible uses and lowering the risk of pump malfunction, and a small-volume reciprocating pump being built inside the radiator body and providing power required to propel the coolant.

BRIEF DESCRIPTION OF THE DRAWINGS

The invention may be readily understood with the detailed description below accompanied by the following drawings, in which like numeral references denote like elements, where.

DETAILED DESCRIPTION OF THE PREFERRED EMBODIMENTS

The invention relates to a water-cooling radiator for a computer chip. Especially, the invention relates to a radiator having a built-in and branched coolant circulation flow path with air-cooling and water-cooling mechanisms. The invention inherits the high performance of a conventional water-cooling radiator, while having the simple structure of a conventional air-cooling radiator. To implement those features mentioned above, the invention includes the following elements for the improvement.

1. A Built-In Circulation Flow Path

To make the dissipating fins and the coolant contact with each other closely such that heat conduction efficiency can be enhanced, the invention combines the dissipating fins and the circulation flow path into one single piece of structure. That is, the circulation flow path is built into the body of the radiator so as to increase the contacting surface between the coolant and the body and hence to increase the heat conduction efficiency. In addition, the invention has a simpler structural design for its one-piece radiator body, as compared to a multi-piece installation of parallelly arranged dissipating fins along the outside of the coolant circulation pipelines.

The manufacturing process of the built-in circulation flow path is the major factor which decides if the invention can be implemented. In the invention, the radiator body is joined up from several blocks. The space required for the coolant circulation flow path is established by forming the coolant circulation path on a contacting surface of each block by cutting, rolling, or molding, and then joining the contacting surface of each block in a face-to-face fashion, i.e., each block is welded at its peripheral edge to make the contacting surface join with other blocks. After welding, all the blocks together form a watertight body to prevent leakage during coolant circulation. In addition, the contacting surfaces between the blocks remain parallelly contacted and may have a small in-between block gap. This in-between block gap is extremely small in dimension so that nearly all of the coolant flows in the direction of the predetermined circulation flow path.

Regarding the internal pressure experienced by the radiator body to hold and propel the coolant, the invention maintains a very small pressure difference (supplied by a pump) of roughly one-twentieth of the atmospheric pressure to keep the coolant flowing. Due to this low pressure difference, the blocks can be joined by only welding the peripheral edges and a few internal welding spots between the contacting surfaces. It is adequate to provide strength in this way for the body to hold the internal pressure caused by the coolant. The body does not rupture due to pressure variation resulting from the coolant circulation.

2. A Branched Circulation Flow Path

The purpose of the branched circulation flow path is to accelerate heat dissipation by distributing the high-temperature coolant, having absorbed heat from the chip, to dissipating fins which have larger surface areas, cover a wider extent on the radiator body, and are distributed more evenly on the body. In accordance with the invention, the built-in coolant circulation flow path in the body does not have the pipeline joining problems encountered in a conventional design when the flow path branches out or intersects. Therefore, the design and manufacture of the flow path can be flexible in which coolant circulation branches can be formed without adding cost and structural complexity. Specifically, the branches can be arranged in various configurations and distributed on the same surface as the flow path.

3. Both Water-Cooling and Air-Cooling Mechanisms Performed on a One-Piece Body

The invention dissipates heat similarly to a conventional water-cooling radiator does when the coolant is circulating in the internal flow path. The heat generated from the computer chip is transferred to the distal dissipating fins by circulation of the coolant to achieve heat dissipation. Conversely, the invention dissipates heat similarly to a conventional air-cooling radiator does when the coolant is not circulating in the internal flow path. The heat generated from the computer chip is transferred to the distal dissipating fins by conduction using heat-conducting metallic materials to achieve heat dissipation.

4. Small-Volume Reciprocating Pump

The invention provides a pump for driving the coolant. The working principle of the pump is based on using attractive and repulsive forces induced by a magnetic field to drive an internal piston to undergo reciprocating motion. In particular, a magnetic field is produced when electric current flows through a coil. By changing the current direction, the direction of the magnetic field changes. A continuous alternation of the direction of the magnetic field enables the piston having a permanent magnet as its main body to move reciprocatingly. During the reciprocating motion period of the piston, check valves are used to ensure the coolant flows in a single direction.

In short, the coolant circulation of the invention is similar to blood circulation in a human body. The heart acts as a starting point for blood recirculation in the human body. The blood is pumped by the heart to flow around inside the body and recirculates back to the heart. The aforementioned blood circulation takes the heat generated within the body to the skin surface such that body heat can be dissipated. Likewise, the pump provided in the invention acts as a starting point for recirculation of the coolant. The coolant is pumped by the pump and flows towards each of the parallelly arranged dissipating fins, where the heat is dissipated to the air, then the coolant recirculates back to the pump.

Figure 1A:
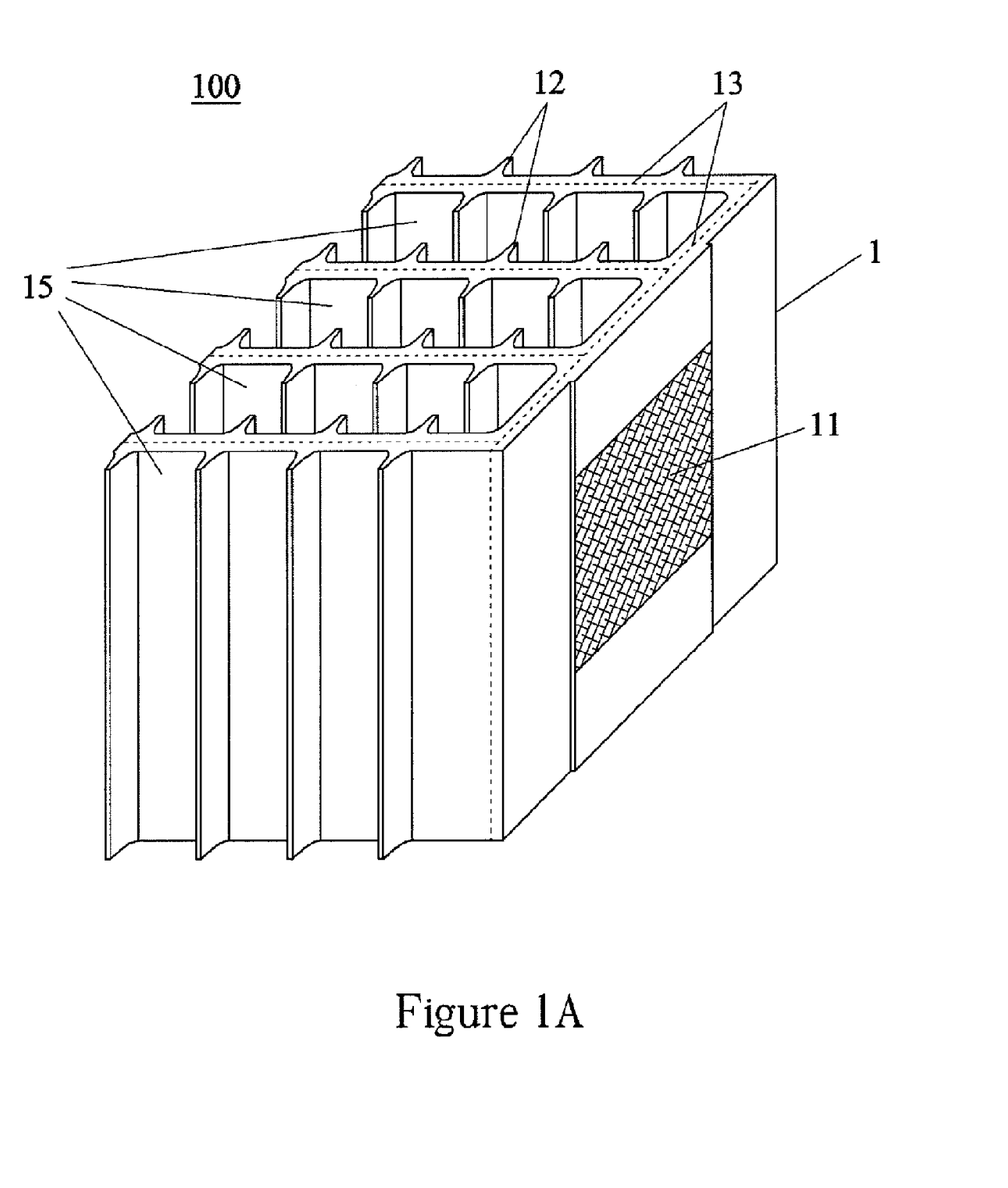
FIG. 1A shows a perspective view of the radiator according to one embodiment of the invention.
Figure 1B:
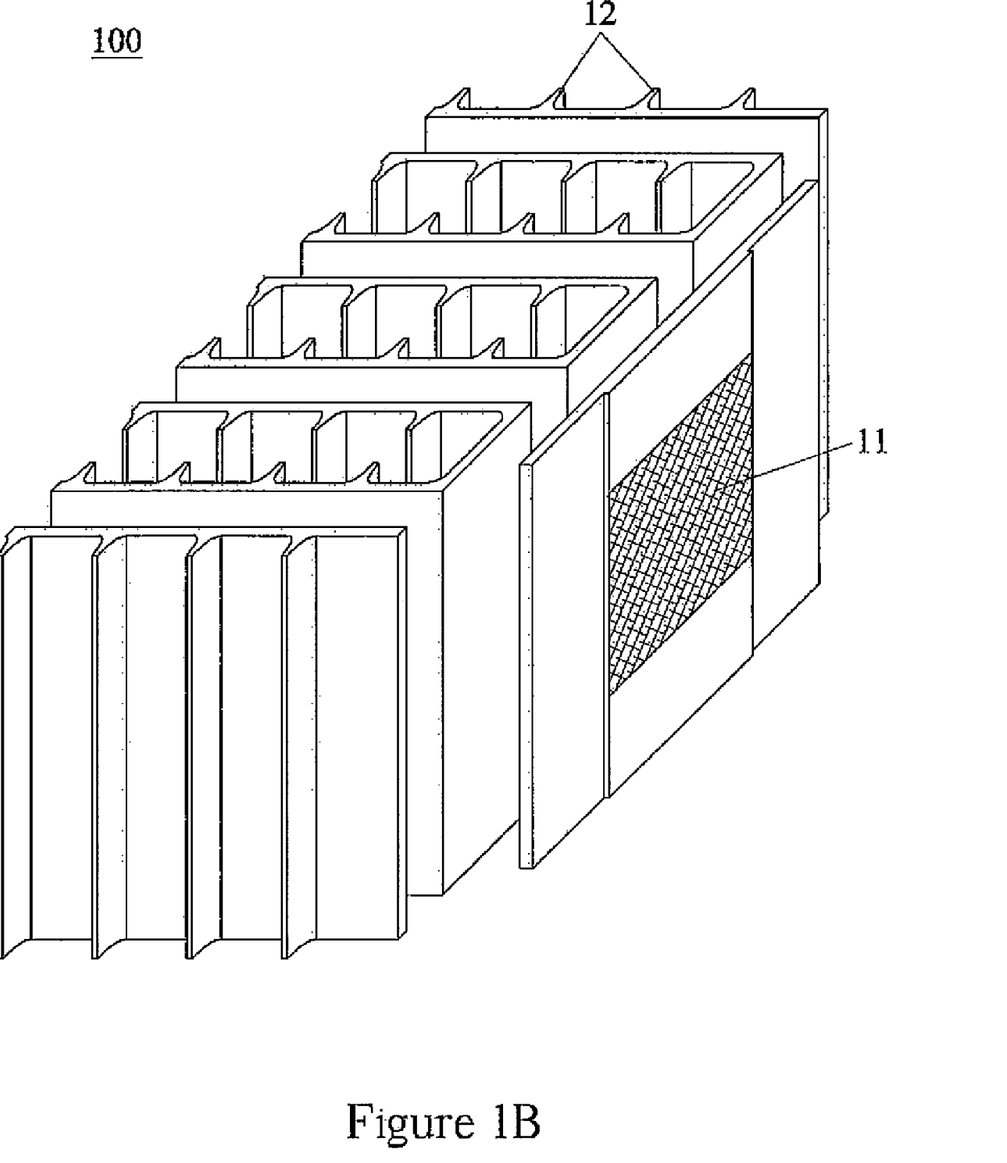
FIG. 1B shows an exploded view of the radiator according to the embodiment of the invention.

FIG. 1A shows a perspective view of a radiator 100 according to one embodiment of the invention. FIG. 1B shows the exploded view of blocks used to assemble the radiator 100 according to the embodiment of the invention. As shown in FIG. 1A, the radiator 100 includes a body 1. The body 1 includes a chip mounting surface 11, a plurality of parallelly arranged dissipating plates 15, and a plurality of parallelly arranged dissipating fins 12, wherein the dissipating fins 12 are disposed on the surfaces of the dissipating plates 15. The body 1 is made of heat-conducting metallic materials. In addition, the body 1, to which other elements are fixed, provides surfaces needed for heat exchange. The chip mounting surface 11 is provided as a heat conduction interface between the body 1 and the chip (not shown), and through the chip mounting surface 11 heat generated by the chip is conducted to the dissipating fins 12 of the body 1. As shown in FIG. 1B, the body 1 consists of a plurality of blocks. Since the blocks are joined together by welding at their peripheral edges, welding seams 13 is formed between the blocks (FIG. 1A).

Figure 2:
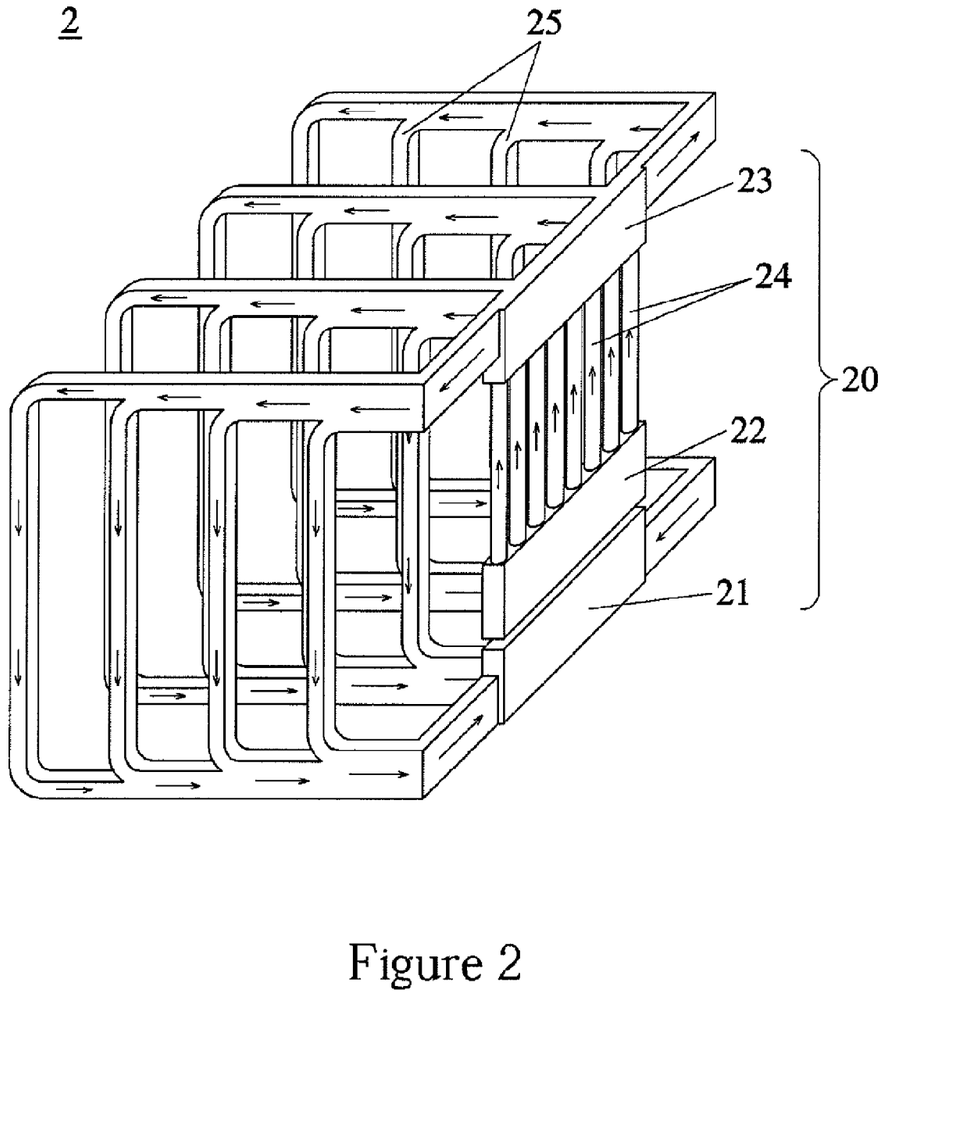
FIG. 2 shows a schematic diagram of an internal circulation flow path for heat convection according to the embodiment in FIG. 1.

FIG. 2 shows a schematic view of an internal circulation flow path 2 for producing heat convection according to one embodiment of the invention. The internal circulation flow path 2 is built inside the body 1 to provide the required passage for the coolant (not shown) to flow through. As shown in FIG. 2, the internal circulation flow path 2 includes a first communication region 21, a second communication region 22, a third communication region 23, one or more parallelly arranged dissipating flow paths 24, and a plurality of coolant circulation branches 25. The one or more dissipating flow paths 24 are configured to make the coolant flow through underneath the chip mounting surface 11, and have both ends respectively connect the second communication region 22 and the third communication region 23. The plurality of coolant circulation branches 25 connect the first communication region 21 and the third communication region 23. A pump 3 shown in FIG. 5 connects the first communication region 21 to the second communication region 22. The heat conducted from the chip to the chip mounting surface 11 can be transmitted to the coolant in the internal circulation flow path 2 via the one or more dissipating flow paths 24. When the coolant carrying heat flows through the circulation branches 25, the heat is conducted through the circulation branches 25 to the dissipating fins 12 and then passed to the external environment, where the heat generated by the computer chip is finally dissipated. Additionally, the arrows shown in FIG. 2 indicate the path of heat convection undergone by the coolant.

In another embodiment of the invention, the internal circulation flow path 2 may include only a communication dissipation region 20 (i.e., merging the first communication region 21, the second communication region 22, the third communication region 23, and the one or more dissipating flow paths 24 into one single section) and a plurality of coolant circulation branches 25. In this embodiment, the communication dissipation region 20 is configured to make the coolant flow through adjacent the chip mounting surface 11.

Figure 3:
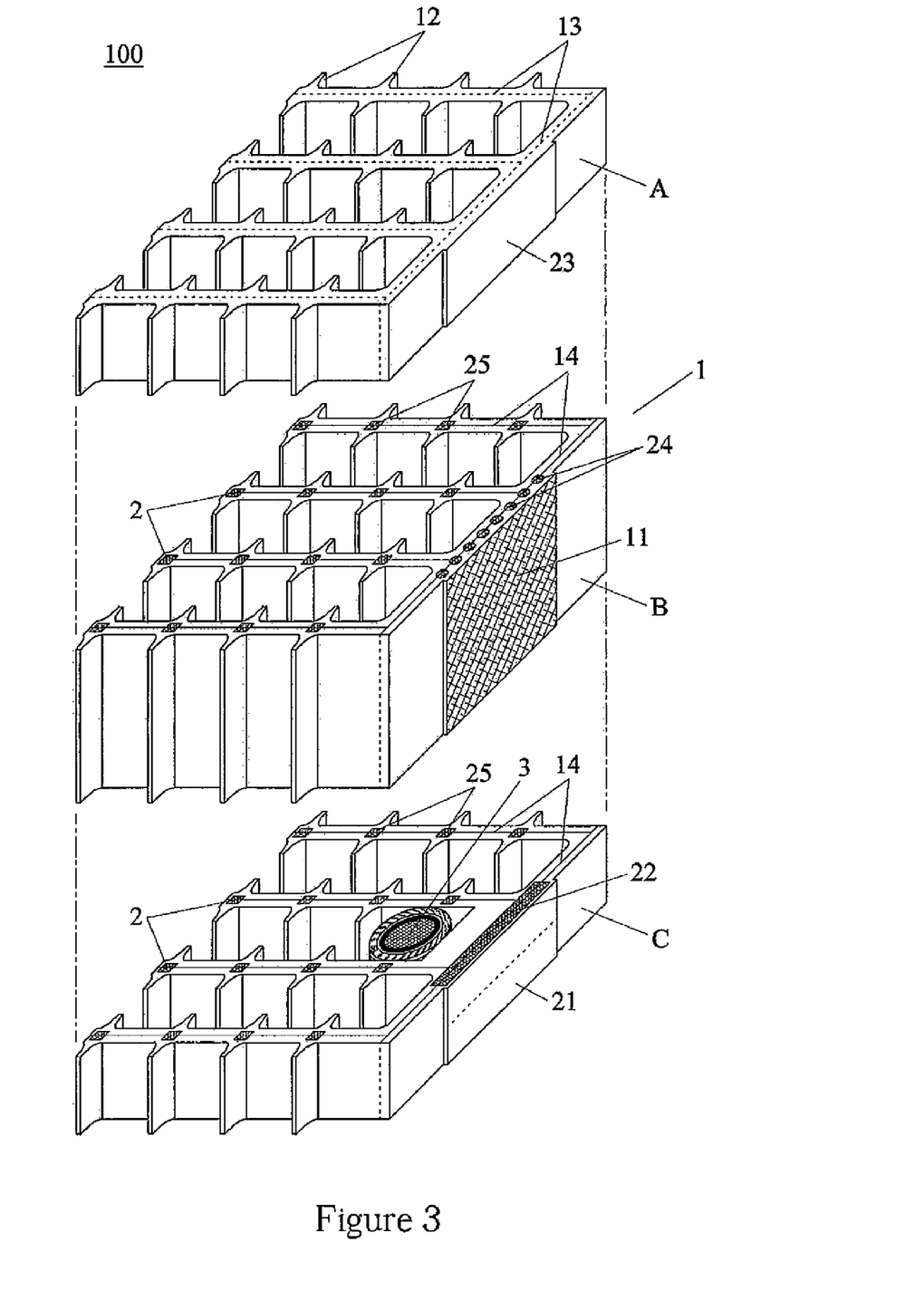
FIG. 3 shows the inner and outer structures of the radiator dissected into parts A, B, and C according to the embodiment in FIGS. 1 and 2.

FIG. 3 illustrates the inner and outer structures of the radiator 100 according to the embodiment in FIGS. 1 and 2. For illustration purposes, the body 1 is dissected into parts A, B, and C in FIG. 3. Part A mainly indicates welding seams 13 and the third communication region 23; part B mainly indicates the chip mounting surface 11, the in-between block gaps 14, the dissipating flow paths 24, and the coolant circulation branches 25; and part C mainly indicates the pump 3, the in-between block gaps 14, the first communication region 21, the second communication region 22, and the coolant circulation branches 25. As shown in FIG. 3, it can be clearly observed that the internal circulation flow path 2 is built inside the body 1, the parallelly arranged dissipating flow paths 24 enable the coolant to flow through adjacent the chip mounting surface 11, and the pump 3 is fixed to the side of the body near the computer chip. The pump 3 supplies the necessary power to drive the coolant to flow. Additionally shown in part B and part C are tiny in-between block gaps that exist between two contacting surfaces of the blocks, and because this in-between block gap is substantially small, most of the coolant is able to flow along in the predetermined circulation flow path.

Figure 4:
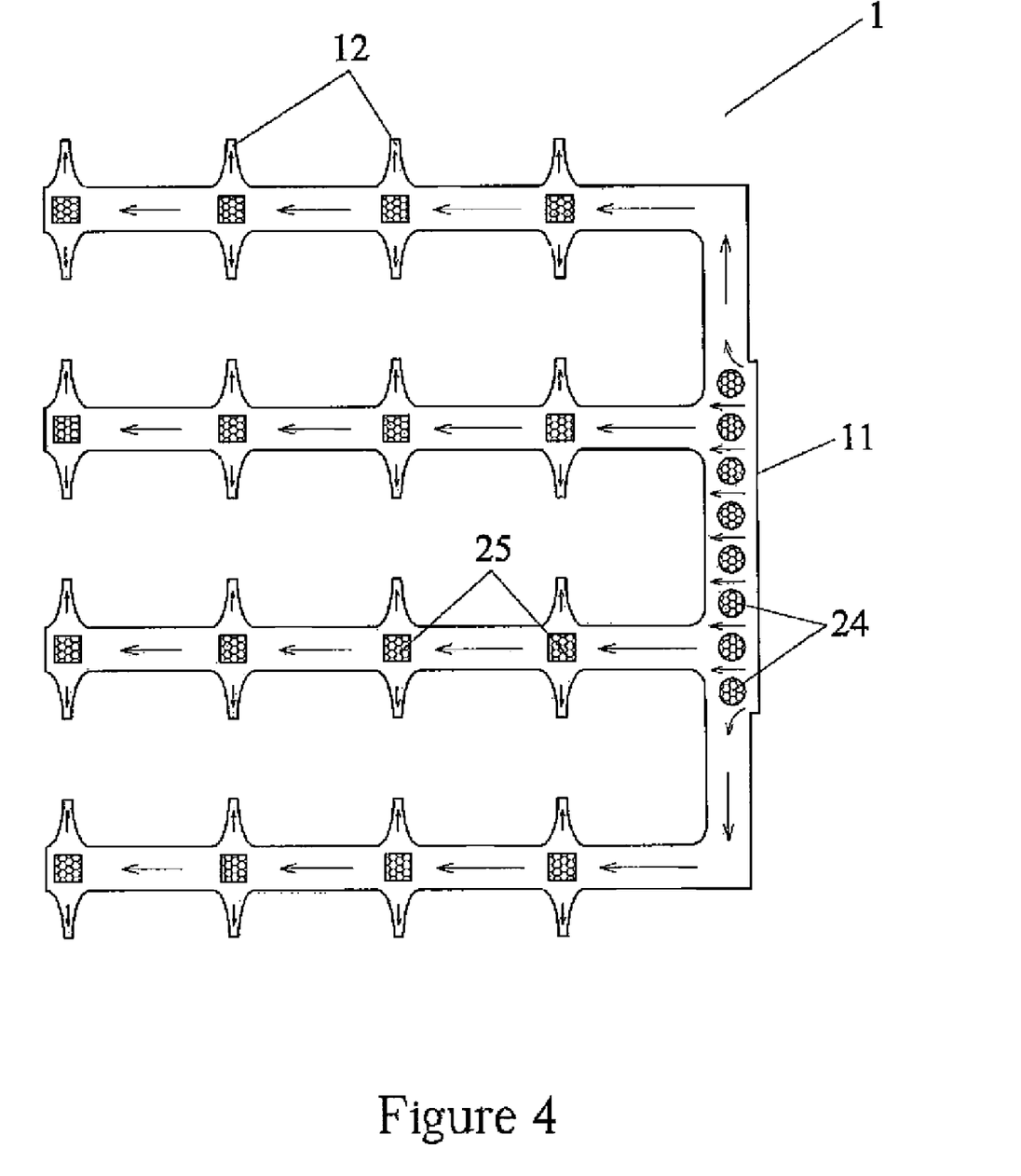
FIG. 4 is a top view of part B in FIG. 3.

FIG. 4 shows a top view of part B in FIG. 3. When the heat generated by the computer chip is conducted to the chip mounting surface 11, the heat can be conducted from the chip mounting surface 11 and pass through and around the dissipating flow paths 24 to reach each of the coolant circulation branches 25 and each of the dissipating fins 12 via the body 1 made of heat-conducting metallic materials. FIG. 4 shows the arrows that indicate the conduction directions of the heat generated by the computer chip in the body 1.

Figure 5:
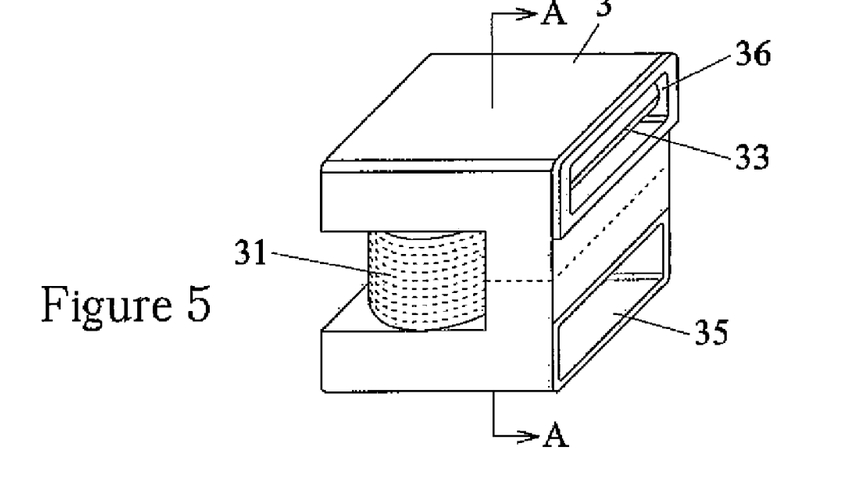
FIG. 5 shows a perspective view of the pump according to the embodiment of the invention.
Figure 6A:
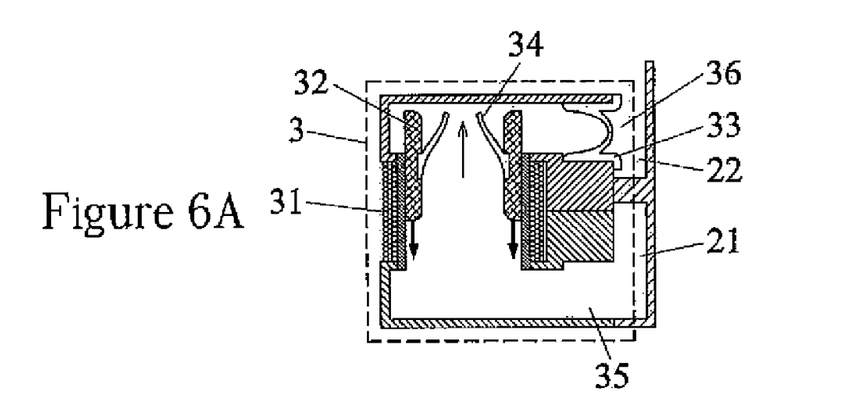
FIG. 6A is a schematic cross-sectional view along the line A-A of FIG. 5, showing permanent magnets and a second check valve in a returning movement in the pump connecting the communication regions.
Figure 6B:
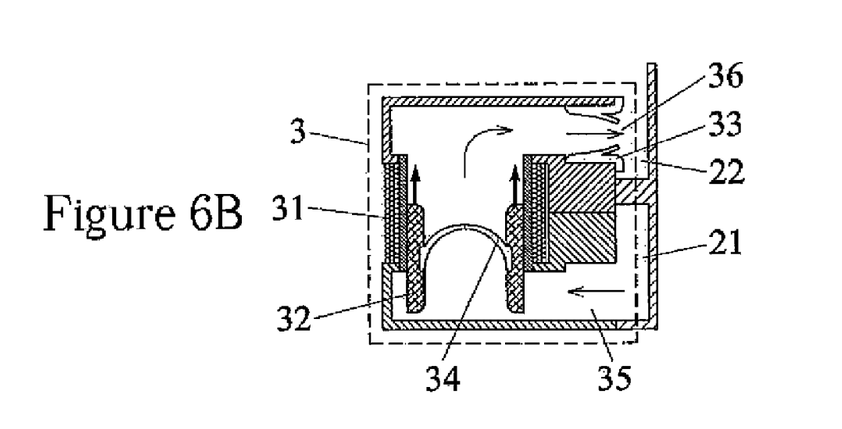
FIG. 6B is a schematic cross-sectional view along the line A-A of FIG. 5, showing the pump-in and pump-out movement of the coolant in the pump connecting the communication regions.

FIG. 5 shows a perspective view of the pump 3 according to one embodiment of the invention. FIG. 6A is a schematic cross-sectional view along the line A-A of FIG. 5, showing permanent magnets 32 and a second check valve 34 in a returning movement to a close configuration of the second check valve 34 in the pump 3. FIG. 6B is also a schematic cross-sectional view along the line A-A of FIG. 5, showing the pump-in and pump-out movement of the coolant in the pump 3.

Viewed from the external as shown in FIG. 5, the pump 3 has a coil 31, a first check valve 33, a coolant inlet 35, and a coolant outlet 36.

As shown in FIGS. 6A and 6B, the pump 3 includes the magnets 32 and the second check valve 34. For illustration purposes, the pump 3 is represented by the region inside the dotted line. The coolant inlet 35 connects the first communication region 21, and the coolant outlet 36 connects the second communication region 22. Therefore, as shown in FIG. 2, the pump 3 together with the first communication region 21, the second communication region 22, the third communication region 23, the dissipating flow paths 24, and the circulation branches 25 form a heat convection loop. In one embodiment of the invention, the open/close of the first check valve 33 and the second check valve 34 may be reversed so that the coolant circulation direction is reversed. That is, the coolant may enter the pump 3 via the coolant outlet 36 and leave the pump 3 via the coolant inlet 35. When electric current passes through the coil 31 shown in FIG. 5, a magnetic field is induced. The direction of the magnetic field can be changed by changing the direction of the current. The continuous alternation of the direction of the magnetic field results in the reciprocating motion of the permanent magnets 32. During the reciprocating motion period of the permanent magnets 32, the coolant is made to flow in a single direction by operating the first check valve 33 and the second check valve 34.

In summary, the invention has the following characteristics: a built-in coolant circulation flow path in the radiator body solves the problem of covering a coolant in pipelines; and dissipating fins and coolant circulation branches combined to form one single piece of structure to increase the contacting surface area and heat conduction efficiency, while keeping a simple structure. Specifically, as compared to a conventional radiator (air-cooling or water-cooling), the invention has the advantages of: (1) a built-in circulation flow path improving the heat conduction efficiency with a simpler structure than that of the prior art; (2) a branched circulation flow path enabling the coolant to cover a larger extent of the body surface and having a better heat dissipation efficiency; (3) both air-cooling and water-cooling mechanisms performed on a one-piece body allowing flexible uses and lowering the risk of pump malfunction; and (4) a small-volume reciprocating pump built inside the radiator body and providing power required to drive the coolant to flow.

While the invention has been shown and described with reference to a preferred embodiment thereof, and in terms of the illustrative drawings, it should not be considered as limited thereby. Various possible modifications, omissions, and alterations could be conceived of by one skilled in the art to the form and the content of any particular embodiment, without departing from the scope of the invention.

The invention claimed is:

1. A water-cooling radiator for a computer chip, the radiator using circulation of a coolant to improve heat dissipation, the radiator comprising:
    a body having a chip mounting surface, a plurality of parallelly arranged dissipating plates, and a plurality of parallelly arranged dissipating fins;
    an internal circulation flow path built inside the body to provide a passage required for the coolant to flow through, the internal circulation flow path comprising:
        a first communication region;
        a second communication region;
        a third communication region;
        one or more parallelly arranged dissipating flow paths enabling the coolant to flow through adjacent the chip mounting surface, the one or more dissipating flow paths having two ends respectively connected to the second communication region and the third communication region; and
        a plurality of parallelly arranged circulation branches connecting the first communication region and the third communication region; and
    a pump fixed to the side of the body near the computer chip to provide power to drive the coolant to flow, and to enable the first communication region to connect to the second communication region,
    wherein each of the plurality of parallelly arranged dissipating plates comprises two or more circulation branches.

2. The radiator of claim 1, wherein the chip mounting surface provides a heat conduction interface between the computer chip and the body.

3. The radiator of claim 1, wherein the one or more dissipating flow paths transmit the heat, generated by the chip and conducted to the chip mounting surface, to the coolant, and the pump drives the coolant such that the coolant flows through the plurality of parallelly arranged circulation branches from which the heat generated by the chip is conducted to the plurality of dissipating plates and the plurality of dissipating fins and transmitted to external environment.

4. The radiator of claim 1, wherein the heat generated by the computer chip can be directly conducted to the plurality of dissipating plates and the plurality of dissipating fins via the chip mounting surface, to transmit the heat to external environment.

5. The radiator of claim 1, wherein the pump comprises a first check valve and a second check valve, and provides power to drive the coolant to flow in a single direction by use of the reciprocating opening and closing movement of the first check valve and the second check valve.

6. A cooling device using a coolant circulation, the cooling device comprising:
    a body having a mounting surface, a plurality of parallelly arranged dissipating plates, and a plurality of parallelly arranged dissipating fins, the mounting surface contacting a heat generating object;
    an internal circulation flow path built inside the body to provide a passage required for the coolant to flow through, the internal circulation flow path comprising:
        at least one communication dissipation region to make the coolant flow through adjacent the mounting surface; and
        a plurality of parallelly arranged circulation branches connecting to the at least one communication dissipation region so as to form the internal circulation flow path; and
    a circulation driving device connecting the at least one communication dissipation region and driving the coolant to circulate,
    wherein each of the plurality of parallelly arranged dissipating plates comprises two or more circulation branches.

7. The cooling device of claim 6, wherein the mounting surface provides a heat conduction interface between the body and the heat generating object.

8. The cooling device of claim 6, wherein the at least one communication dissipation region transmits the heat, generated by the heat generating object and conducted to the mounting surface, to the coolant, and the coolant circulation transmits the heat to the plurality of parallelly arranged circulation branches, thereby the heat generated by the heat generating object is conducted to the plurality of dissipating plates and the plurality of dissipating fins and transmitted to external environment.

9. The cooling device of claim 6, wherein the mounting surface directly conducts the heat generated by the heat generating object to the plurality of dissipating plates and the plurality of dissipating fins to transmit the heat to external environment.

10. The cooling device of claim 6, wherein the circulation driving device is a pump.

* * * * *